(12) United States Patent
Simmons et al.

(10) Patent No.: US 12,191,128 B2
(45) Date of Patent: Jan. 7, 2025

(54) MOVABLE MAGNET ARRAY FOR MAGNETRON SPUTTERING

(71) Applicant: INTELLIVATION LLC, Fort Collins, CO (US)

(72) Inventors: Michael G. Simmons, Fort Collins, CO (US); Joshua D. Misek, Fort Collins, CO (US); Mark George, Fort Collins, CO (US)

(73) Assignee: Intellivation LLC, Fort Collins, CO (US)

( * ) Notice: Subject to any disclaimer, the term of this patent is extended or adjusted under 35 U.S.C. 154(b) by 170 days.

(21) Appl. No.: 17/794,329

(22) PCT Filed: Mar. 11, 2021

(86) PCT No.: PCT/US2021/021838
§ 371 (c)(1),
(2) Date: Jul. 21, 2022

(87) PCT Pub. No.: WO2021/183729
PCT Pub. Date: Sep. 16, 2021

(65) Prior Publication Data
US 2023/0052340 A1 Feb. 16, 2023

Related U.S. Application Data

(60) Provisional application No. 62/988,075, filed on Mar. 11, 2020.

(51) Int. Cl.
*H01J 37/34* (2006.01)
*C23C 14/35* (2006.01)

(52) U.S. Cl.
CPC ...... *H01J 37/3455* (2013.01); *H01J 37/3405* (2013.01); *H01J 37/342* (2013.01);
(Continued)

(58) Field of Classification Search
CPC .. H01J 37/3455; H01J 37/342; H01J 37/3405; H01J 37/3452; H01J 37/3461; C23C 14/35
See application file for complete search history.

(56) References Cited

U.S. PATENT DOCUMENTS 8,608,918 B2 * 12/2013 Kondo ................... C23C 14/35
204/298.12
2004/0178056 A1 9/2004 De Bosscher et al.
(Continued)

FOREIGN PATENT DOCUMENTS

KR 1020040028958 A 4/2004
KR 20120137801 A * 12/2012
WO WO-2016098923 A1 * 6/2016 ............. C23C 14/35

OTHER PUBLICATIONS

KR 20120137801 (Year: 2012).*
Int'l Search Report for PCT/US2021/021838, dated Jul. 1, 2021.

*Primary Examiner* — Michael A Band
(74) *Attorney, Agent, or Firm* — MaxGoLaw PLLC

(57) ABSTRACT

An apparatus for sputtering target material onto a substrate based on a plasma confining racetrack having two parallel straight portions and two turnaround portions includes a tubular target, an elongated magnet array, and a drive mechanism. The tubular target has two ends in proximity to the two turnaround portions and a longitudinal axis about which the target is rotatable. The magnet array is supported within the target to generate a plasma-confining magnetic field. The array includes a central stationary portion of magnets and two axially movable shunts positioned at the ends of the stationary portion. Each shunt carries a magnet segment configured to slidably extend from each end of the stationary portion to define a gap. The gaps are positioned internal to the turnaround portions. The drive mechanism (Continued)

axially moves the shunts parallel to the longitudinal axis of the target to vary a width of the gaps.

18 Claims, 8 Drawing Sheets

(52) U.S. Cl.
CPC ...... *H01J 37/3452* (2013.01); *H01J 37/3461* (2013.01); *C23C 14/35* (2013.01)

(56) References Cited

U.S. PATENT DOCUMENTS

| | | |
|---|---|---|
| 2006/0000705 A1 | 1/2006 | Hartig et al. |
| 2010/0018854 A1 | 1/2010 | McLeod |
| 2016/0289820 A1 | 10/2016 | Madocks et al. |
| 2018/0030591 A1 | 2/2018 | Saitou |

* cited by examiner

MOVABLE MAGNET ARRAY FOR MAGNETRON SPUTTERING

CROSS-REFERENCE TO RELATED APPLICATION

This application claims priority of U.S. Provisional Patent Application Ser. No. 62/988,075, filed Mar. 11, 2020, which is incorporated herein by reference.

FIELD OF THE INVENTION

The present invention relates to a magnet array suitable for magnetron sputtering or reactive sputtering of materials from a cathode target onto a substrate. More particularly, it relates to a magnetron having a magnet array with movable portions to compensate for non-uniform target material utilization for magnetron sputtering of cylindrical targets.

BACKGROUND OF THE INVENTION

Magnetron sputtering of various materials onto substrates such as glass panes and flexible webs involves the use of a cathodic target and a sputter racetrack that generates a plasma region proximal to the target to induce removal of target material and a deposition onto a substrate. Plasma generating racetracks are generally in the shape of an oval, having two parallel linear portions and two turnaround portions joining the linear portions at opposite ends thereof. Targets can be of various configurations, but cylindrical targets that rotate about their axes during a sputtering operation are widely used. These targets are usually tubular and employ a magnet that is positioned within the interior of the target. Although the target rotates about its axis, the magnet commonly does not; rather, the magnet is held in a stationary position as the target rotates. The magnet produces a magnetic field adjacent to the target. This magnetic field confines the plasma to the outer surface of the target.

Unfortunately, it has been found that the targets, which are expensive and often formed of relatively exotic materials, do not wear uniformly and evenly along their lengths as material is sputtered from the outer surface of the target. That is, severe erosion occurs near the ends of the target proximal the turnarounds of the plasma generating racetrack prematurely relative to sputtering erosion at the central region of the target proximal the straight portions of the plasma generating racetrack.

The result of the uneven erosion pattern, with higher sputter rates at the ends of the targets than in the central portion of the target, limits the percent utilization of the target material. That is, the sputter process must be stopped, and the remaining target must be scrapped when target ends are nearly completely eroded, leaving significant amounts of target material at the central region of the target to be wasted and resulting in the need to frequently replace the target, which is costly and a considerable job that causes the sputtering line to be shut down during target replacement.

Attempts have been made to improve the efficiency of target utilization; however better target utilization remains the goal. Attempts to match the erosion of the turnarounds with the straight sections of the target include adding a second racetrack at the turn around regions outside or inside of the primary racetrack to distribute the sputtering zone over a larger surface area. Another approach is the design of a turnaround magnetic field so that the center axis of the turnaround (of the racetrack) moves axially as target material is eroded. These two methods involve sophisticated magnetic field manipulation and are strongly dependent on the thickness and permeability of the target material as well as the sputter yield of the target surface, thus requiring unique solutions for each material type, thickness, and permeability. For magnetic target materials where the magnetic permeability is not well defined and for reactive sputtering processes where the sputter yield changes as a function of the target surface stoichiometry, which changes axially along the target surface, these solutions have not yielded the desired target utilization improvement.

Another approach has been to oscillate the entire magnet or a central portion thereof axially. The axial movement of the magnet is completed in such a way that the rotational position of the target does not correspond to any single axial position of the magnet in any two consecutive rotations of the sputter target tube. For such attempted solutions, the required axial force to induce movement of the magnet is very large and this force increases linearly with the target length and particularly when a magnetic target material is used. This force to move the magnet places a limit on the magnetic material permeability, magnet strength, and target length based on the practical implementation of the power train used to move the magnet axially.

Thus, there exists a need for a magnetron capable of averaging the sputter rate at the ends of the magnetron racetrack to reduce the net target erosion in the turnaround region of the target without regard to the material type, thickness, and permeability of the target material.

SUMMARY OF THE INVENTION

The present invention provides an apparatus for sputtering target material onto a substrate based on a plasma confining racetrack having two parallel straight portions and two turnaround portions connecting the two parallel straight portions at ends thereof. The apparatus includes a tubular target, an elongated magnet array, and a drive mechanism.

The tubular target has two oppositely opposed ends and a longitudinal axis. The ends respectively are in proximity to the two turnaround portions of the racetrack. The target is rotatable around the axis during sputtering operation.

The elongated magnet array is supported within the target and is configured to generate a plasma-confining magnetic field. The elongated magnetic array includes a central stationary portion of magnets and two axially movable shunts each positioned at the opposite ends of the central stationary portion. Each of the shunts is configured to carry a magnet segment that is configured to slidably extend from each respective end of the central stationary portion. Each shunt defines a gap with an end of the central stationary portion. The gaps are each positioned internal to each of the two turnaround portions.

The drive mechanism is configured to axially move the shunts of the magnetic array parallel to the longitudinal axis of the target to vary a width of each of the gaps.

BRIEF DESCRIPTION OF THE DRAWINGS

The present invention is further detailed with respect to the following drawings that are intended to show certain aspects of the present invention but should not be construed as a limit on the practice of the present invention.

DESCRIPTION OF THE INVENTION

Figure 1:
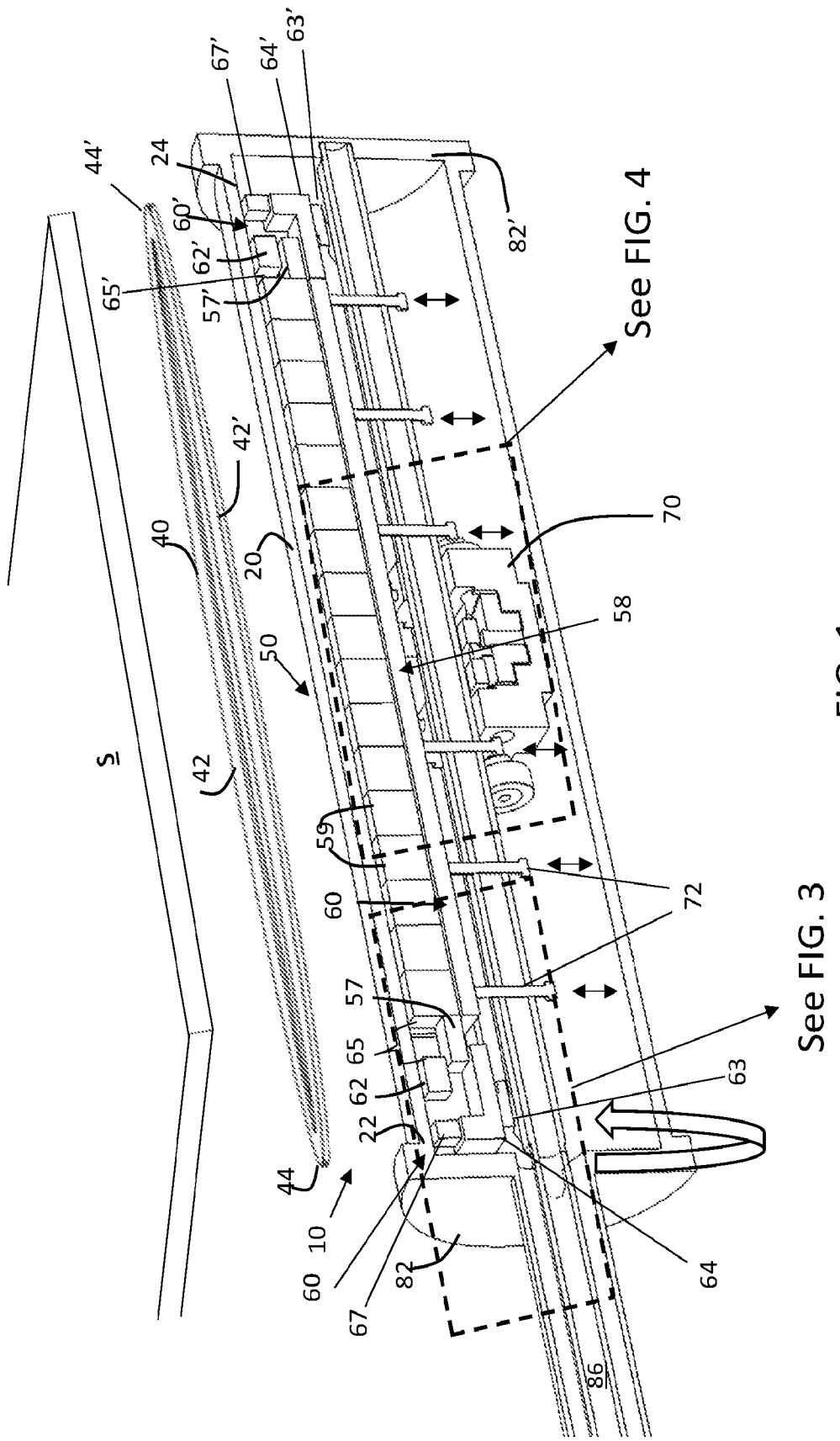
FIG. 1 is a perspective cross-sectional view of a sputtering apparatus according to embodiments of the present invention.

The present invention has utility as a magnetron apparatus for sputtering target material onto a substrate capable of averaging the sputter rate at the ends of the magnetron racetrack to reduce the net target erosion in the turnaround region of the target without regard to the material type, thickness, and permeability of the target material. The present invention achieves improved cylindrical sputter target utilization. An additional benefit provided by the present invention is the ability to increase the magnetic field strength of the magnetron without sacrificing target utilization, which is useful given that there are several thin film materials that benefit from high strength magnetic fields on the target surface. The high strength magnetic field tends to lower the plasma impedance decreasing the target voltage which lowers the energy of recoiled ions that can create defects in the growing thin film. Increasing the magnetic field at the target surface dramatically improves the thin film properties of magnetic materials. With traditional magnet bars it is difficult to increase the magnet strength without a reduction of target utilization. This is because strengthening the magnetic field leads to preferential sputtering at a narrow region in the turnaround which as discussed above decreases target utilization. It is appreciated that the magnet nature of the target material as being diamagnetic, paramagnetic, or ferromagnetic is a factor in the operational conditions for deposition thereof onto a substrate.

It is appreciated that magnet bars used in rotary sputtering are operative with a variety of designs for the straightaway that illiustratively include single row magnet bar with N or S up center, shunts on the outside that enclose a circuit of a three row magnet bar with N or S up center and opposite up polarity outer rows which may be oriented parallel to center row or may be tilted, a four row magnet bar that typically has N or S up center with outer rows typically angled as to pole directionality relative to center.While the drawings that follow are shown with single row magnet bar design for visual clarity, it is appreciated that the present invention is operative with other stationary magnet bar configurations such as those detailed above.

The present invention will now be described with reference to the following embodiments. As is apparent by these descriptions, this invention can be embodied in different forms and should not be construed as limited to the embodiments set forth herein. Rather, these embodiments are provided so that this disclosure will be thorough and complete, and will fully convey the scope of the invention to those skilled in the art. For example, features illustrated with respect to one embodiment can be incorporated into other embodiments, and features illustrated with respect to a particular embodiment may be deleted from the embodiment. In addition, numerous variations and additions to the embodiments suggested herein will be apparent to those skilled in the art in light of the instant disclosure, which do not depart from the instant invention. Hence, the following specification is intended to illustrate some particular embodiments of the invention, and not to exhaustively specify all permutations, combinations, and variations thereof.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention.

Unless indicated otherwise, explicitly or by context, the following terms are used herein as set forth below.

As used in the description of the invention and the appended claims, the singular forms "a," "an" and "the" are intended to include the plural forms as well, unless the context clearly indicates otherwise.

Also as used herein, "and/or" refers to and encompasses any and all possible combinations of one or more of the associated listed items, as well as the lack of combinations when interpreted in the alternative ("or").

Figure 2:
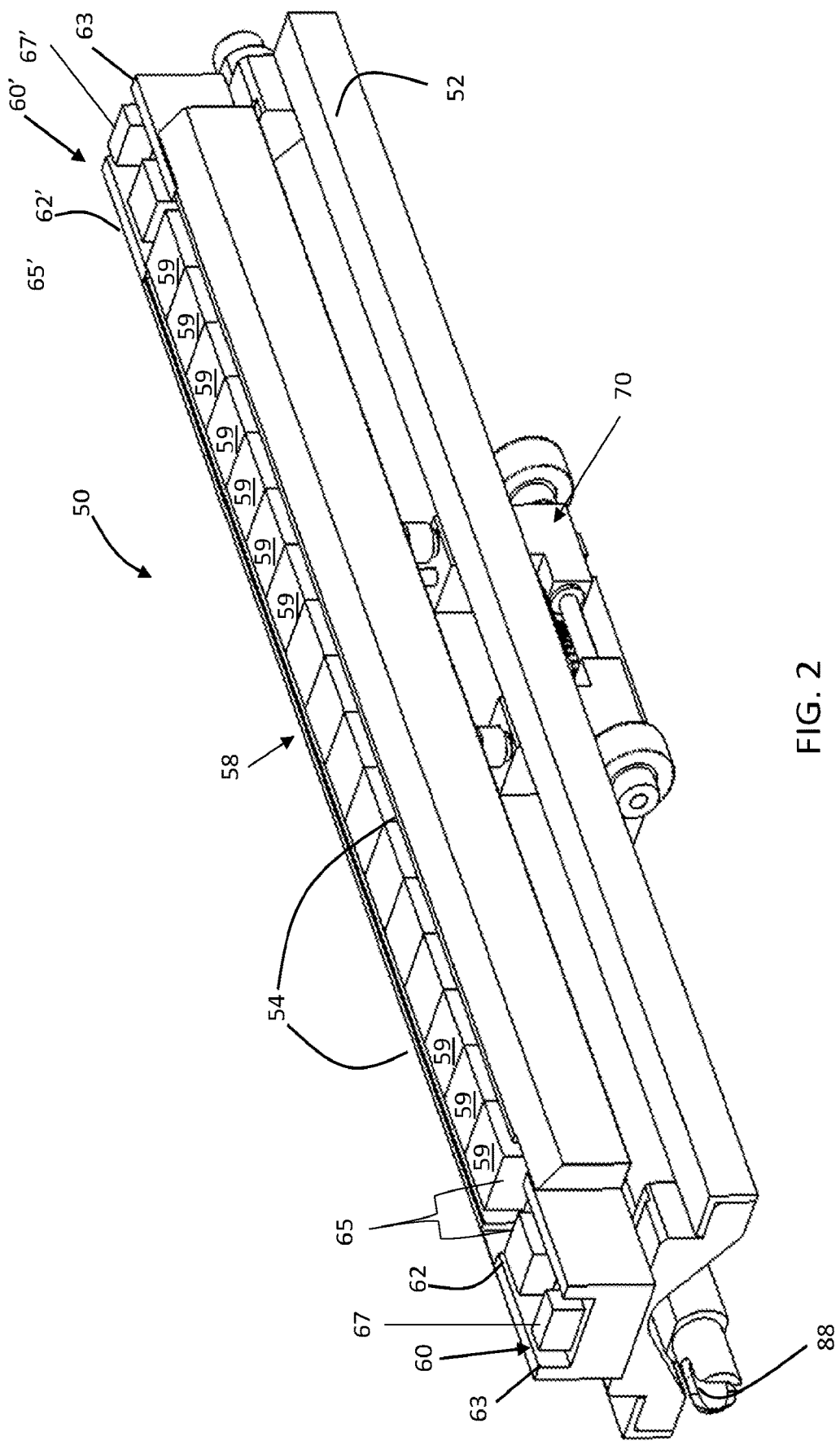
FIG. 2 is a perspective view of the elongated magnet array of FIG. 1.
Figure 3:
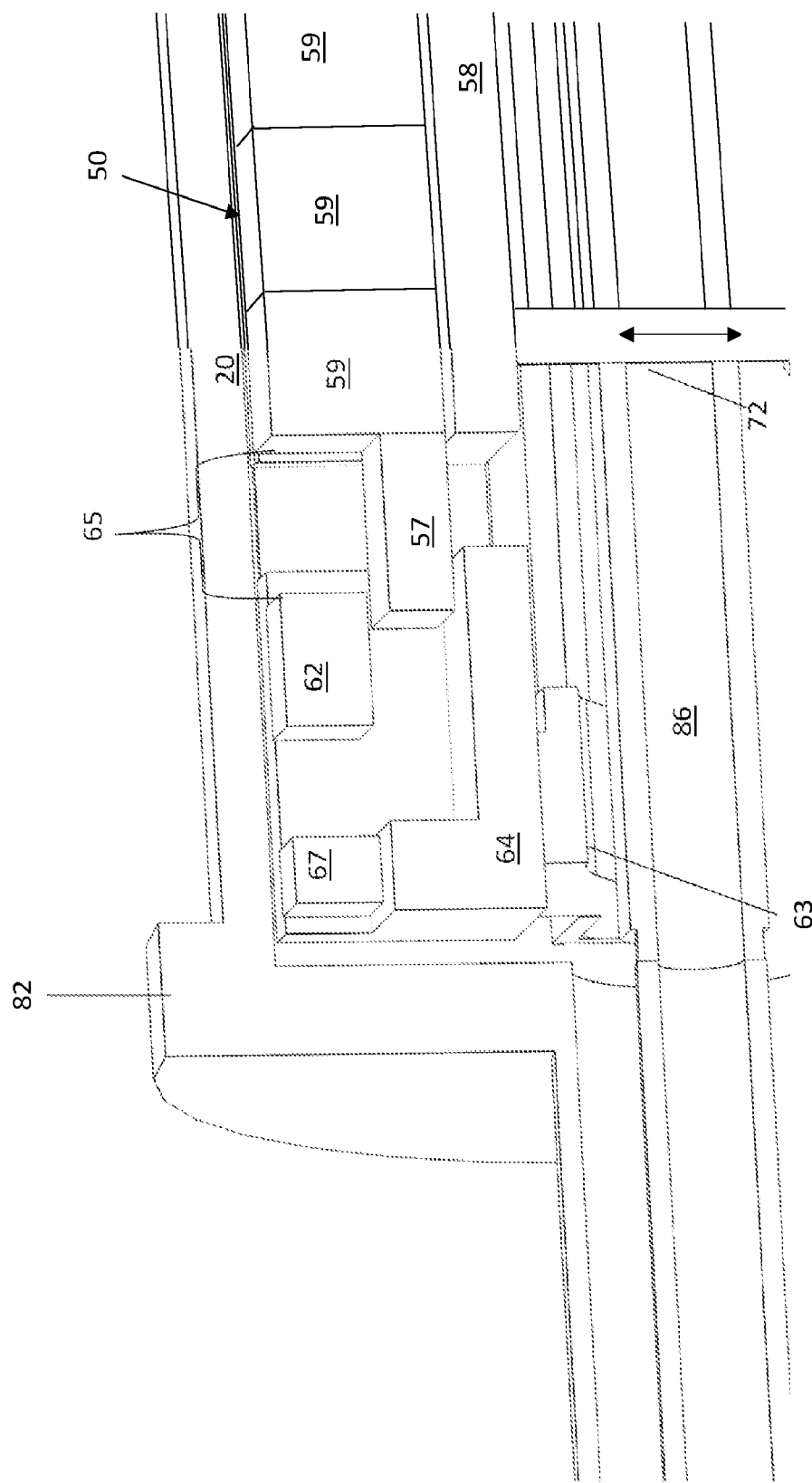
FIG. 3 is a magnified view of the left end portion of FIG. 1.

FIGS. 1-3 shows a sputtering assembly 10 for sputtering target 20 material onto a substrate S in accordance with embodiments of the present invention. According to embodiments, the sputtering assembly 10 includes a plasma confining racetrack 40, a tubular target 20, an elongated magnet array 50, and a drive mechanism 70. It is appreciated that the plasma confining racetrack 40 is an effect of the magnetic field.

The plasma confining racetrack 40 is a conventional sputter racetrack such as those used with existing commercial rotary magnetrons for sputtering processes. An exemplary racetrack magnetron for generating a plasma confining racetrack 40 is detailed in U.S. Pat. No. 6,183,614. The plasma confining racetrack 40 confines a plasma region proximal to the target 20 to induce removal of target material and a deposition onto a substrate S. As shown in FIG. 1, the plasma confining racetrack 40 is generally oval shaped, having two parallel straight portions 42, 42' and two turnaround portions 44, 44' that connect the two parallel straight portions 42, 42' at ends thereof.

The tubular target 20 has two oppositely opposed ends 22, 24 and a longitudinal axis. The tubular target 20 is installed between or is integral with target end blocks 82, 82'. When installed, the ends 22, 24 of the target 20 are respectively in proximity to the two turnaround portions 44, 44' of the plasma confining racetrack 40.

The installed tubular target 20 is rotatable about its longitudinal axis commonly with resort to an electric motor or other motive device of the target end block (not shown). In some embodiments, a cooling fluid inlet and channel 86 runs through the target end block 80. The cooling fluid inlet and channel 86 are useful for providing cooling water, gases, or other fluids to the rest of the sputtering assembly 10 and the tubular target 20 in order to cool the assembly 10 during the sputtering process. It is conventional for the sputtering assembly 10 to be cantilevered, as shown in FIG. 1, however, in some inventive embodiments both end blocks are supported.

The elongated magnet array 50 of the sputtering assembly 10 is supported and carried within the tubular target 20 for generation of a plasma-confining magnetic field exterior to but adjacent the target 20. The elongated magnet array 50 extends longitudinally parallel to the longitudinal axis of the target 20. As shown in FIG. 2, a "fork" feature 88 is provided for supporting the magnet array 50 against rotation within the target 20, such that the "fork" 88 constrains the magnet array 50 and restrains it against rotation.

An elongated magnet array 50 includes a central stationary portion 58 and two axially movable shunts 60, 60' at the ends of the stationary portion 58. As best shown in FIG. 3, the central stationary portion 58 of the magnet array 50 includes a plurality of individual magnets 59, which according to embodiments are formed of rare earth magnets such as samarium cobalt (SmCo) or neodymium-iron-boron (NdFeB). While the present invention is detailed in the accompanying drawings as a single row straightaway magnet bar design it is appreciated that the present invention is wholly operative with a variety of stationary magnet bar designs that illustratively include any number of rows of magnets, unitary and monolithic magnet bars, or combinations thereof. It is appreciated that the present invention is operative with a variety of stationary magnet bar configurations. Additionally, it should be appreciated that while magnets are generically depicted as cuboidal, that each magnet of a given bar design can assume a variety of polyhedral shapes that illustratively include pyramidal, cylindrical, conical, cubic and prismatic. The plurality of individual magnets 59 are present in a central stationary portion 58. In some inventive embodiments, the central stationary portion 58 additionally has two opposing ends that are each formed of magnet segments 57, 57', respectively, while in others an end joint is formed between distal magnets 59 of the central stationary portion 58 with the movable magnets. It is appreciated that the present invention can afford improvement in target utilization with only one end having movable magnets as detailed. While FIG. 3, shows only one end of the elongated magnet array 50, it will be understood that the two ends of the elongated magnet array 50 can be the same, have different gap forming or even one end being static. The magnet segments 57, 57' at the ends of the central stationary portion 58 each have a thickness less than the magnets 59. According to some embodiments, the second thickness t of the magnet segments 57 at the ends of the central stationary portion 58 is from 0.1 to 5 times the thickness of the individual magnets 59 of the central stationary portion 58. According to some inventive embodiments, each of the magnet segments 57, 57' at the ends of the central stationary portion 58 has a magnetic polarity N upward face, while in other embodiments orientations vary between contiguous magnets, or a polarity S upward face relative to, for example a terminal magnet 59 with magnetic polarity N upward face.

The two axially movable shunts 60, 60' of the elongated magnet array 50 are each positioned at the opposite ends of the central stationary portion 58. Each of the shunts 60, 60' are configured to carry a magnet segment 62, 62'. Each of the carried magnet segments 62, 62' is configured to slidably nest or stack with each respective end of the central stationary portion 58 and magnets 57 and 57', if present. According to the present invention each of magnet segments 62, 62' may carry independently a magnetic polarity that is north up, south up, or non-orthogonal orientation relative to the central stationary portion 58. In some inventive embodiments, an end magnet segments 57, 57' underlie carried magnet segments 62, 62', respectively. According to embodiments, the shunts 60, 60' include a holder portion 63, 63' to retain a carried magnet segment 62, 62' and slide relative to a respective magnet segment 57,57' at the ends of the central stationary portion 58. The holder portions 63, 63' are depicted in the drawings as have a general U-shape in which carried magnet segments 62, 62' fit respectively, yet it is appreciated that holder portions 63, 63' are readily formed in a variety of shapes. The holder portions 63, 63' are readily formed 63 and 63' can be constructed of shunts, non-permeable, magnetic and/or hold shaped shunts, shaped non-permeable material or shaped magnets at selected orientations to close magnetic field lines. In some inventive embodiments, an ancillary magnet 67, 67' is positioned outward relative to each of carried magnet segments 62, 62' and having a different orientation relative to carried magnet segments 62, 62' and serves to close the terminal magnetic field lines.

According to some inventive embodiments, each of the shunts 60, 60' includes a base portion 64, 64' that is configured to slidably nest below the magnet segment 57 at each end of the central stationary portion 58 of said elongated magnet array 50. Regardless of the configuration of the shunts 60, 60', dynamic gaps 65 (65' not shown for shunt 60') exist and change width as a function of time to improve target utilization. In contrast to the prior art, the gap 65 in some inventive embodiments is centered not under the curved portion of a plasma generating racetrack, but rather under a straight away portion of the racetrack (synonymously referred to herein as parallel straight portions). It is appreciated that modification of the uniform plasma under the straightaway portion of the racetrack create additional operational complexity, yet achieves superior levels of target utilization.

Figure 4:
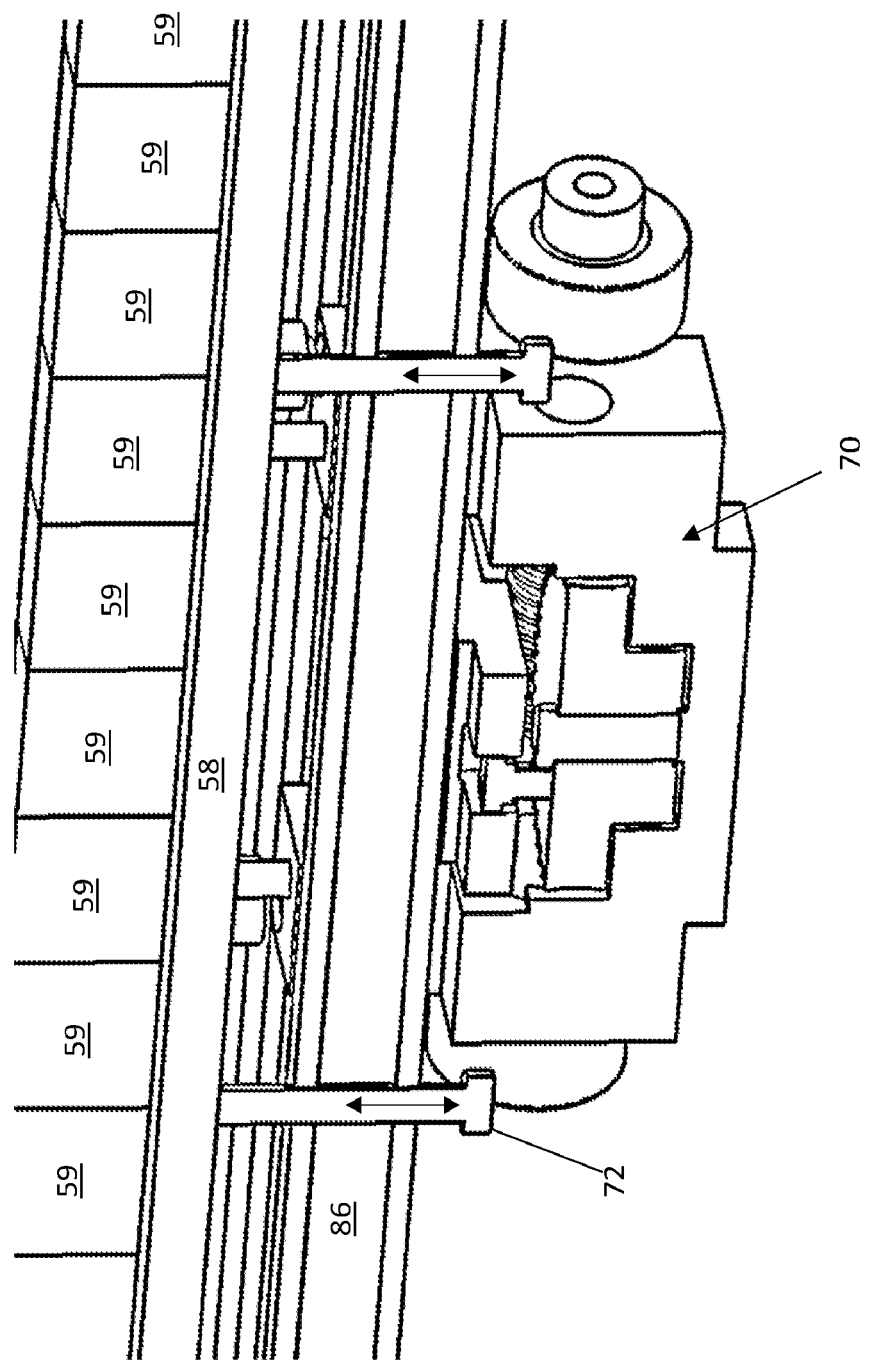
FIG. 4 is a magnified view of the central portion of FIG. 1.

The drive mechanism 70 shown in magnified view in FIG. 4 is configured to axially move the shunts 60, 60' of the elongated magnet array 50 inward and outwards in a linear fashion so as to be more distal and then more proximal to the central stationary portion 58. According to some inventive embodiments, the axial movement of the shunts 60, 60' is coupled from the rotation of the target 20, so that the axial movement of the shunts 60, 60' and the target 20 rotation about its axis happen simultaneously. A friction drive couples the rotation of the target 20 to a set of gears as shown in FIG. 4 that drive a reciprocating gear or a cam with a cam follower that moves the shunts 60, 60' with a predetermined axial distance. The profile of the cam is specifically designed to change the axial movement velocity as a function of the position of the cam. A return spring may be used to keep the cam and the cam follower in intimate contact during the rotation of the cam. According to embodiments, the velocity profile may be customized in a number of ways such as geometry selection of the purely mechanical cam follower and cam slot components, or through variation of the target rotation speed with axial position of the moving magnetic components. According to embodiments, the drive mechanism 70 is a scotch yoke, using a round cam follower and a straight slot. Other conventional mechanical drive mechanisms operative herein include a geared rack and pinion. This results in a sinusoidal linear velocity profile which dwells at the ends of travel and accelerates through the middle of the travel. Other profiles for the slot can create other motion profiles. Another way to change the motion profile is to vary the rotational velocity of the target 20, and to synchronize this with moving shunts 60, 60' positions. A linear velocity profile can be beneficial in some inventive embodiments.

According to other inventive embodiments, the axial movement of the shunts 60, 60' is not coupled to the target rotation and utilizes a separate distinct power train. This separate power train drive mechanism and moves the shunts 60, 60' axially, asynchronous of the target 20 rotation. In some situations, this may be the more desirable movement of the shunts 60, 60' relative to the target 20 rotation so that no one axial position of the shunts 60, 60' corresponds to the same rotational position of the target 20.

The shunts 60, 60' are moved parallel to the longitudinal axis of the target 20 to promote uniform target utilization along the length of the target 20. The back and forth axial movement of the shunts 60, 60' also causes the carried magnet segments 62, 62' to move with the shunts 60, 60', which results in the carried magnet segments 62, 62' slidably moving out of and into stacked alignment with the respective magnet segment 57 at each end of the central stationary portion 58. As best shown in FIG. 3, when the shunt 60 is moved away from the central stationary portion 58 and the carried magnet segment 62 is slid out of stacked alignment with the magnet segments 57 at the end of the central stationary portion 58, a gap 65 is formed between the carried magnet segment 62 and the end of the central stationary portion 58. It will be understood that the shunt 60' at the second end of the central stationary portion 58 operates in the same manner as that described for the shunt 60. A gap 65, or 65' that is formed between the carried magnet segment 62 and the end of the central stationary portion 58 is configured to underlie at least a portion of the straight portions 42, 42' of the plasma generating racetrack 40, as best shown in FIG. 1. According to embodiments, the gap 65 that is formed between the carried magnet segment 62 and the end of the central stationary portion 58 does not underlie the turnaround portions 44, 44' of the plasma generating racetrack 40. It is appreciated that the present invention is readily used with other dynamic gap openings that are aligned with the racetrack turnarounds 44 or 44'.

According to embodiments, the drive mechanism moves the shunts 60, 60' synchronously. According to embodiments, a complete movement cycle of the shunts 60, 60' includes movement of each shunt 60, 60' away from the central stationary portion 58 of the magnet array 50 and back to a closest position to the central stationary portion 58. According to embodiments, the shunts 60, 60' are each axially movable at least one centimeter away from the central stationary portion 58 of the magnet array 50, such movement being sufficient to substantially even out the wear pattern of any target 20.

According to embodiments the drive mechanism 70 is configured to convert the rotational movement of the target 20 into linear movement of the shunts 60, 60'. According to embodiments, this is accomplished by the drive mechanism 70 being a scotch yoke. According to embodiments, the drive mechanism 70 is driven by water that is supplied to the drive mechanism 70 by the water inlet and channel 86. According to such embodiments, the water supplied to the drive mechanism 70 by the water inlet and channel 86 drives a worm gear of the drive mechanism 70. According to embodiments, the axial movement of the shunts 60, 60' correspond to the rotation of the target 20. According to embodiments, a complete cycle of the shunts corresponds to 1 to 10,000 rotations of the target 20 about its longitudinal axis.

According to embodiments, the drive mechanism 70 is further configured to move the elongated magnet array 50 or the stationary portion 58 in a direction perpendicular to the longitudinal axis of the target 20 as denoted by the dual-headed arrows shown FIGS. 1, 3, and 4. In instances where axially perpendicular motion is achieved by the drive mechanism 70, actuators 72, 72' move the elongated magnet array 50 in a direction perpendicular to the longitudinal axis of the target 20. In still other inventive embodiments, a separate drive mechanism is provided for the vertical displacement. Other drive mechanisms 70 operative herein include a pneumatic or hydraulic to control the dynamic position of the shunts 63, 63'. In these inventive embodiments, the actuators 72, 72' move the elongated magnet array 50 closer to and farther away from the inner surface of the target 20 in order to maintain a distance that is equal to the distance from the outer surface of the target 20 and the magnet array 50. It is appreciated that static perpendicular inventive embodiments utilize threaded fasteners as actuators 72, 72'.

In operation with perpendicular displacing embodiments, as the material of the target 20 is sputtered off the outer surface of the target 20 during a sputtering process, the distance between the outer surface of the target 20 and the magnet array 50 decreases. To account for the shrinking distance between the outer surface of the target 20 and the magnet array 50, the actuators 72, 72' of the drive mechanism move the elongated magnet array away from the inner surface of the target 20 in a direction perpendicular to the longitudinal axis of the target 20. Thus, the distance between the elongated magnet array 50 and the inner surface of the target 20 remains constant with the distance between the outer surface of the target 20 and the plasma region generated by the plasma confining racetrack 40.

Referring now to FIGS. 5-8 in which like reference numeral have the meaning associated therewith based on the aforementioned drawings, various configurations of carried magnets are shown that interact with different shaped end segments of the stationary central portions 58. For purposes of visual clarity the opposing mirror image end is not shown in these drawings.

Figure 5:
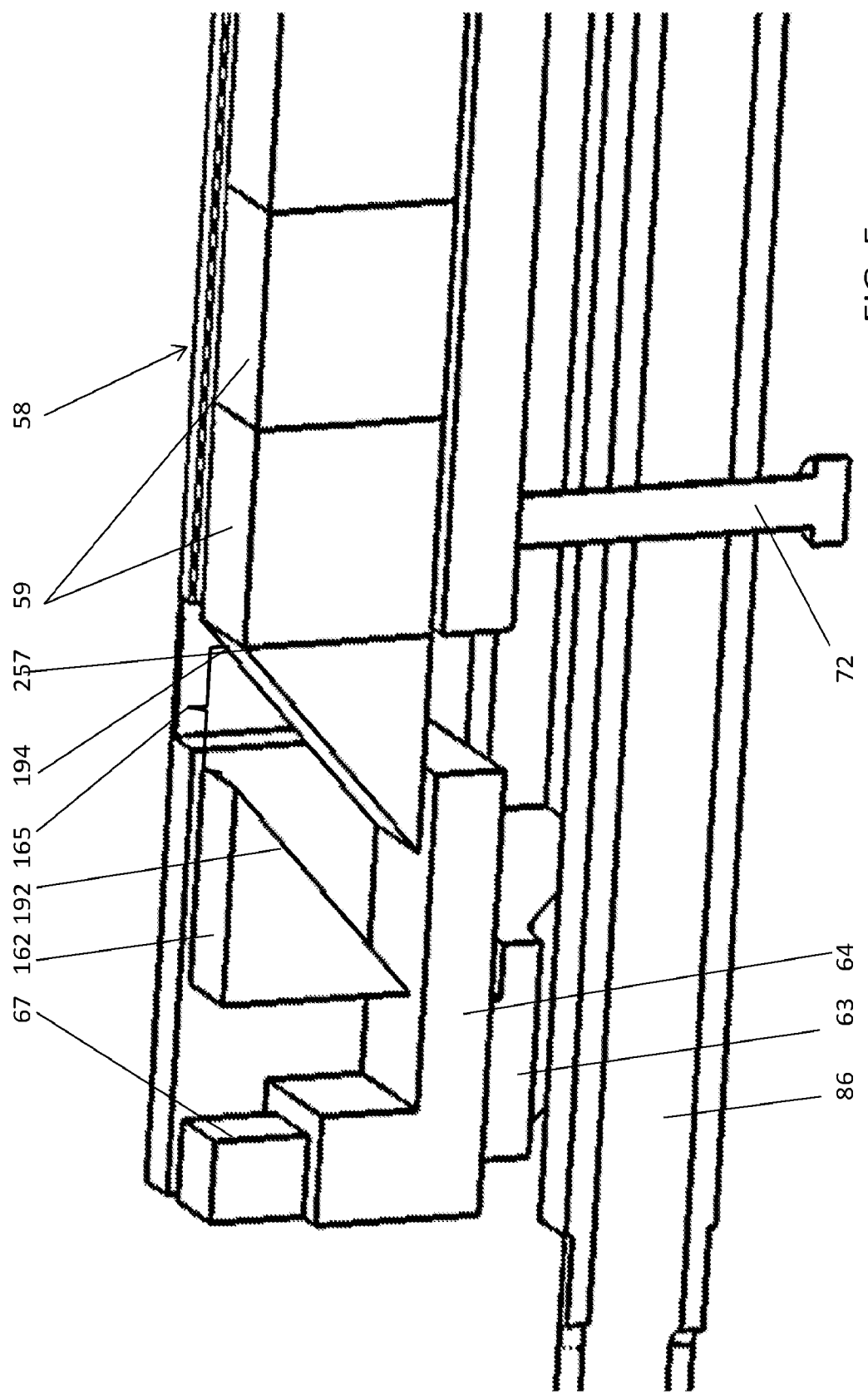
FIG. 5 is a perspective cross sectional view of an alternate embodiment of a moveable shunt configuration according to the present invention.

Specifically, FIG. 5 shows in cross-section, a stationary central portion 58 for plurality of magnets 59 terminates in a wedge-shaped magnet 257 that other than a difference in shape has the attributes of magnet segment 57. A wedge-shaped carried magnet segment 162 moves relative to portion 257 at the ends of the central stationary portion 58. The holder portions 163 is readily formed in a variety of shapes. The holder portion 63 includes a base portion 64 that is configured to slidably nest below the magnet segment 257 to define a gap 165. The gap 165 is noted to have a non orthogonal quadrangular shape. It is appreciated that in some inventive embodiments the surfaces 192 and 194 of the carried magnet segment 162 and the magnet segment 257 are complementary as shown, while in other embodiments discontinuities exist in one or both such surfaces. An ancillary magnet 67 is provided in some inventive embodiments.

Figure 6:
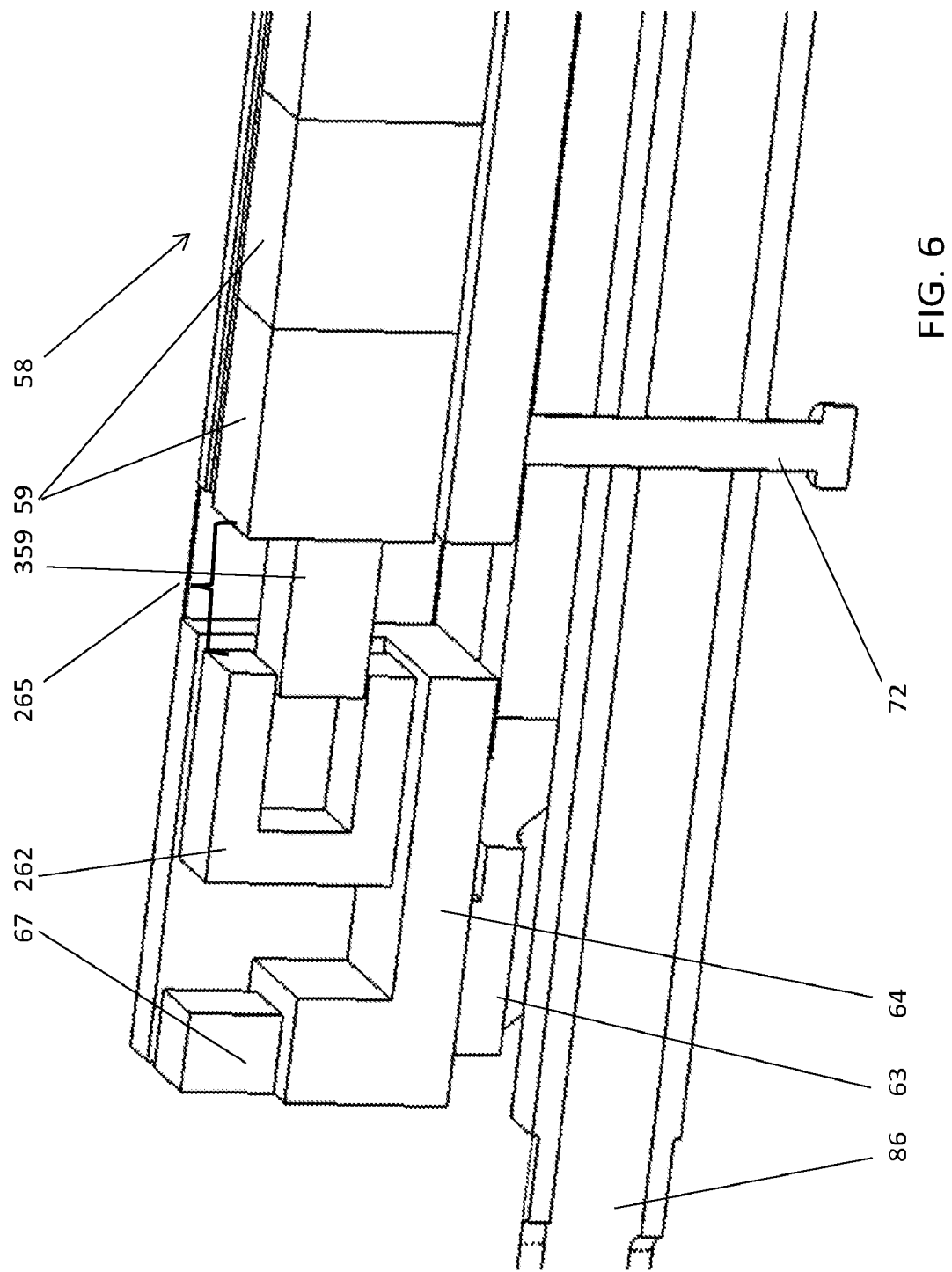
FIG. 6 is a perspective cross sectional view of another alternate embodiment of a moveable shunt configuration according to the present invention.

FIG. 6 shows in cross-section, a stationary central portion 58 for of magnets 59 that terminates in a magnet 357 that other than a difference in shape has the attributes of magnet segment 57. A C-shaped carried magnet segment 262 moves relative to portion 357 at the ends of the central stationary portion 58 to define a gap 265. The holder portions 63 is readily formed in a variety of shapes. The holder portion 63 includes a base portion 64 that is configured to slidably nest below the magnet segment 357. An ancillary magnet 67 is provided in some inventive embodiments.

Figure 7:
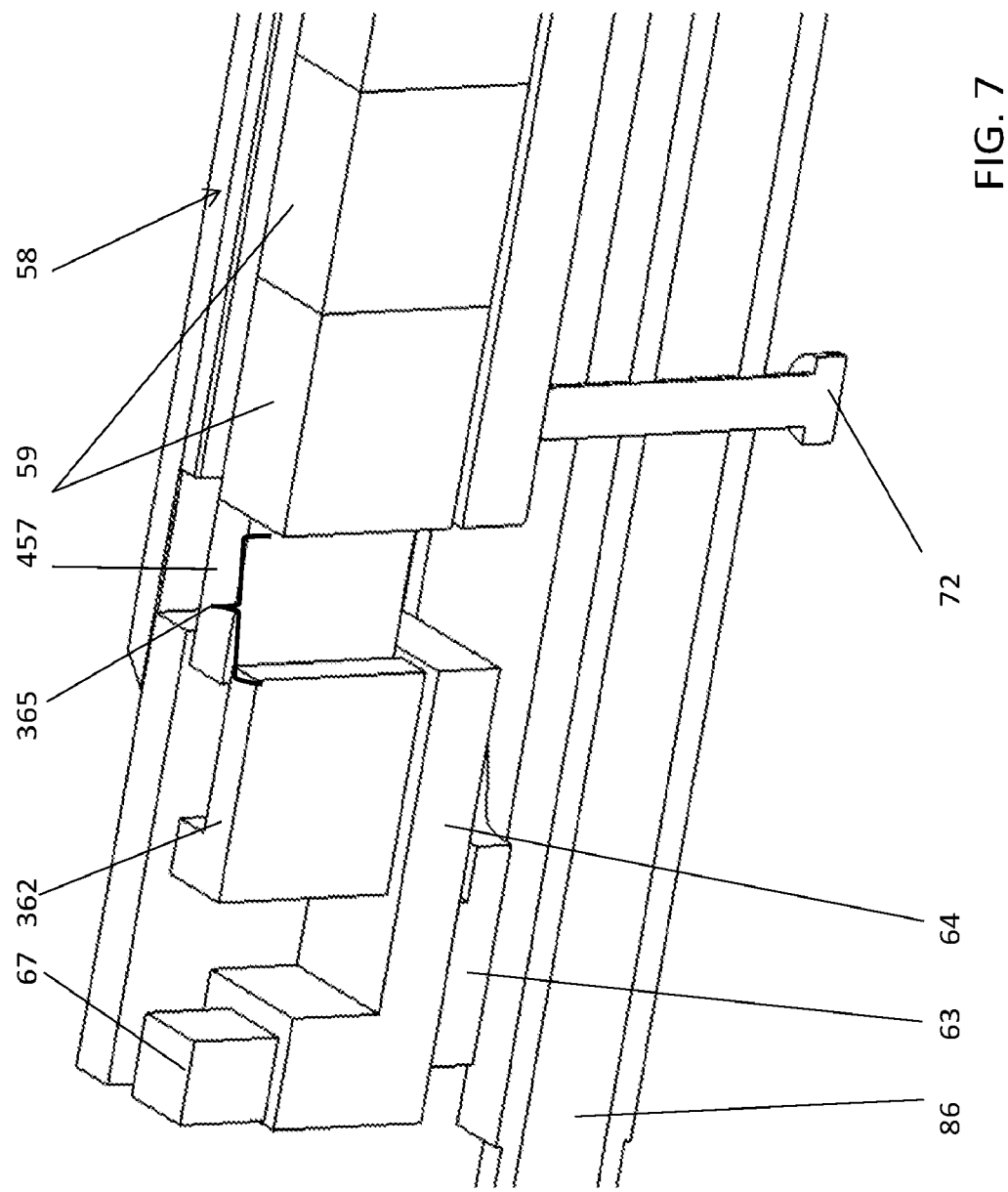
FIG. 7 is a perspective cross sectional view of still another alternate embodiment of a moveable shunt configuration according to the present invention.

FIG. 7 shows in cross-section, a stationary central portion 58 for of magnets 59 that terminates in a magnet 457 that other than a difference in shape has the attributes of magnet segment 57. A carried magnet segment 362 moves adjacent to portion 457 at the ends of the central stationary portion 58 to define a gap 365. The holder portions 63 is readily formed in a variety of shapes. The holder portion 63 includes a base portion 64 that is configured to slidably nest below the magnet segment 457. An ancillary magnet 67 is provided in some inventive embodiments.

Figure 8:
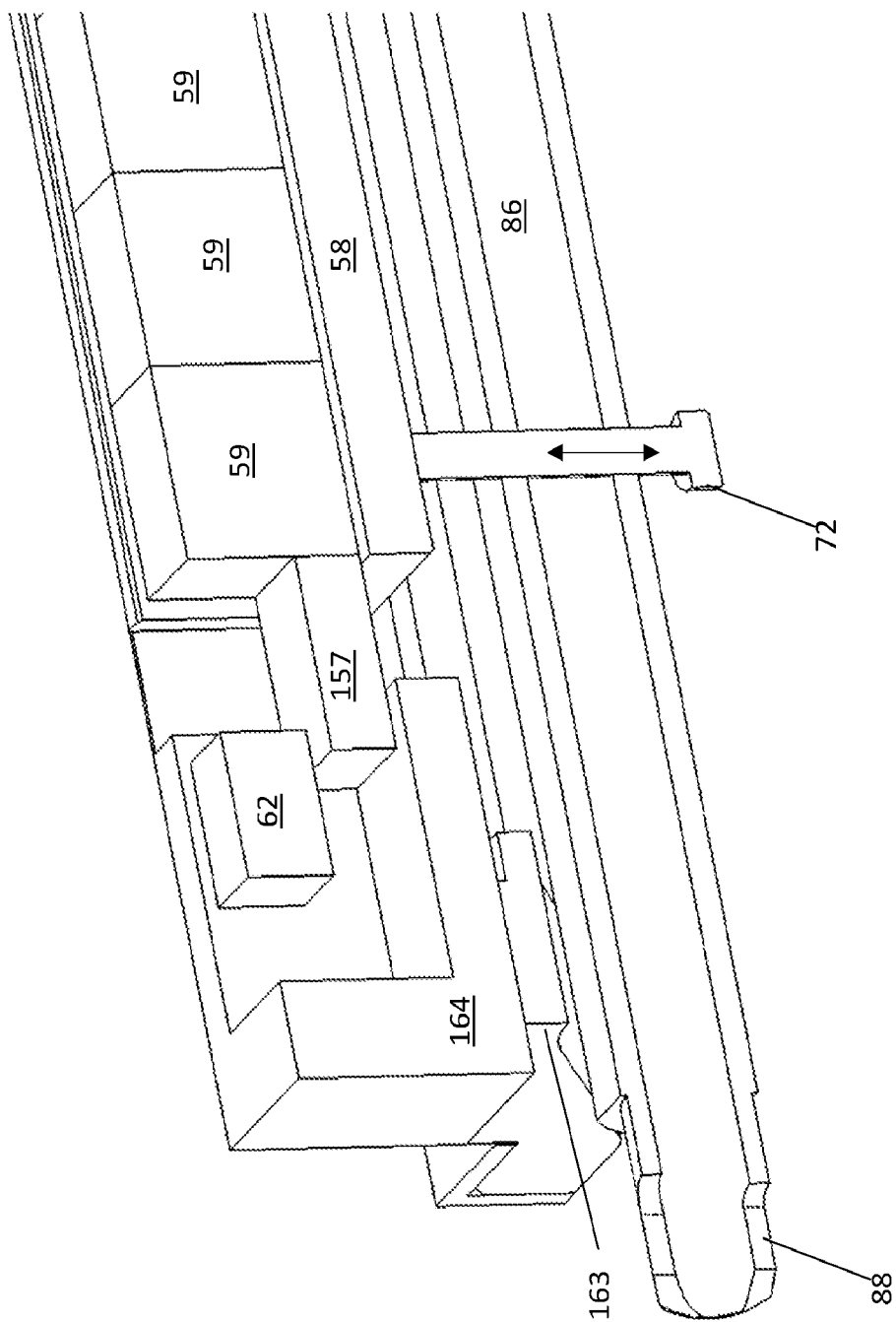
FIG. 8 is a perspective cross sectional view of still another alternate embodiment of a moveable shunt configuration according to the present invention.

FIG. 8 shows in cross-section, an alternate embodiment relative to that shown in FIGS. 1-4 in which like reference numeral have the meaning associated therewith based on the aforementioned drawings. A base portion 164 extends further upward and around the carried magnet 62 as part of a holder 163. No separate ancillary magnet being shown therein.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention but is not meant to be a limitation upon the practice thereof. The following claims, including all equivalents thereof, are intended to define the scope of the invention.

The invention claimed is:

1. An apparatus for sputtering target material onto a substrate based on a plasma confining racetrack having two parallel straight portions and two turnaround portions connecting the two parallel straight portions at ends thereof, said apparatus comprising:

a tubular target having two oppositely opposed ends and a longitudinal axis, the ends respectively being in proximity to the two turnaround portions of said racetrack, said tubular target being rotatable around said longitudinal axis during sputtering operation;

an elongated magnet array supported within said tubular target parallel to the longitudinal axis of said tubular target and configured to generate a plasma-confining magnetic field, said elongated magnet array comprising:

a central stationary portion having two ends oppositely opposed and comprising a plurality of central stationary magnets positioned between the two ends thereof, each of the plurality of central stationary magnets having a first thickness, the central stationary portion additionally having a stationary magnet segment extending respectively from each of the two ends of the central stationary portion, each of the stationary magnet segments having a second thickness that is smaller than the first thickness of the central stationary magnets; and two axially movable shunts each positioned at the two ends of the central stationary portion and configured to slidably move relative to the two ends of the central stationary portion, each of the shunts having a carried magnet segment positioned thereon, wherein as each of the shunts is slidably moved away from each respective end of the central stationary portion, a dynamic gap is formed between each respective end of the central stationary portion and each respective carried magnet segment, and as each of the shunts is slidably moved toward each respective end of the central stationary portion, each carried magnet segment is configured to nest with each stationary magnet segment, respectively; and a drive mechanism configured to axially move the shunts of the elongated magnet array parallel to the longitudinal axis of the tubular target to vary a width of each of the dynamic gaps.

2. The apparatus of claim 1 wherein each of the plurality of central stationary magnets is a rare earth magnet.

3. The apparatus of claim 1 wherein the dynamic gaps each underlie at least a portion of one of the two parallel straight portions.

4. The apparatus of claim 1 wherein the first thickness of the plurality of central stationary magnets is larger than a third thickness of each of the carried magnet segments.

5. The apparatus of claim 1 wherein each of the shunts is U-shaped.

6. The apparatus of claim 5 wherein the stationary magnet segment at each end of the central stationary portion is configured to fit within a central portion of each U-shaped shunt.

7. The apparatus of claim 1 wherein each shunt includes a base portion that is configured to slidably nest below the stationary magnet segment at each end of the central stationary portion of said elongated magnet array.

8. The apparatus of claim 1 wherein when each shunt is moved closest to the central stationary portion, each of the carried magnet segments and the stationary magnet segments at each of the two ends of the central stationary portion are in a stacked configuration.

9. The apparatus of claim 1 wherein each of the carried magnet segments is wedge-shaped, C-shaped, or rectilinear in cross section and complementary to each of the stationary magnet segments that extend from each of the two ends of the central stationary portion.

10. The apparatus of claim 1 wherein said drive mechanism is a scotch yoke or is driven by water via a water inlet.

11. The apparatus of claim 10 wherein when said drive mechanism is driven by water via a water inlet, the water drives a worm gear of said drive mechanism.

12. The apparatus of claim 1 wherein said drive mechanism is further configured to move said elongated magnet array in a direction perpendicular to the longitudinal axis of said tubular target.

13. The apparatus of claim 1 wherein said drive mechanism moves the shunts synchronously or asynchronously with respect to rotation of the tubular target.

14. The apparatus of claim 1 wherein axial movement of the shunts relative to the two ends of the central stationary portion correspond to rotation of the tubular target.

15. The apparatus of claim 1 wherein a complete cycle of the shunts includes movement of each shunt away from the central stationary portion and back to a closest position to each of the two ends of the central stationary portion.

16. The apparatus of claim 1 wherein a distance between the shunts is constant as the dynamic gaps between each of the carried magnet segments and the two ends of the central stationary portion vary in width.

17. The apparatus of claim 13 wherein a complete cycle of the shunts includes movement of each shunt away from the central stationary portion and back to a closest position to each of the two ends of the central stationary portion.

18. The apparatus of claim 16 wherein a complete cycle of the dynamic gaps corresponds to 1 to 10000 rotations of said tubular target.

* * * * *